(12) United States Patent
Kawasaki

(10) Patent No.: US 7,689,880 B2
(45) Date of Patent: Mar. 30, 2010

(54) TEST APPARATUS, TEST METHOD, ANALYZING APPARATUS AND COMPUTER READABLE MEDIUM

(75) Inventor: Kunihiko Kawasaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 196 days.

(21) Appl. No.: 12/047,329

(22) Filed: Mar. 13, 2008

(65) Prior Publication Data

US 2009/0070624 A1    Mar. 12, 2009

Related U.S. Application Data

(63) Continuation of application No. PCT/JP2006/316638, filed on Aug. 24, 2006.

(30) Foreign Application Priority Data

Sep. 15, 2005    (JP)    ............................. 2005-268728

(51) Int. Cl.
*G11C 29/00*    (2006.01)
(52) U.S. Cl. ........................ 714/718; 714/710
(58) Field of Classification Search ................ 365/200, 365/201; 714/720, 723, 719, 5, 718, 710
See application file for complete search history.

(56) References Cited

U.S. PATENT DOCUMENTS 6,603,691 B2 *    8/2003    Yoo et al. .................... 365/201

(Continued)

FOREIGN PATENT DOCUMENTS

JP    2000-91388    3/2000

(Continued)

OTHER PUBLICATIONS

Jin-Fu Li et. al., A Built-In Self-Repair Scheme for Semiconductor Memories with 2-D Redundancy, Proc. International Test Conference, Sep. 2003, pp. 393-402.

*Primary Examiner*—David Ton
(74) *Attorney, Agent, or Firm*—Jianq Chyun IP Office

(57) ABSTRACT

There is provided a test apparatus including a plurality of test signal feeding sections that are provided in a one-to-one correspondence with the plurality of memories under test, where each of the plurality of test signal feeding sections feeds a test signal designed to test a corresponding one of the plurality of memories under test to the corresponding memory under test, a plurality of defect detecting sections that are provided in a one-to-one correspondence with the plurality of memories under test, where each of the plurality of defect detecting sections detects a defect in a corresponding one of the plurality of memories under test, a plurality of first calculating sections that are provided in a one-to-one correspondence with the plurality of memories under test, where each of the plurality of first calculating sections calculates a remedy solution for a corresponding one of the plurality of memories under test and the remedy solution remedies the defect in the corresponding memory under test by replacing a defective storage cell in the corresponding memory under test with a backup cell of the corresponding memory under test, and a second calculating section that takes over, from one or more of the plurality of first calculating sections which have not finished calculating the remedy solutions, the unfinished remedy solution calculations, in response to a start of calculations by the plurality of first calculating sections for remedy solutions for a different group of memories under test, and performs the remedy solution calculations.

12 Claims, 6 Drawing Sheets

U.S. PATENT DOCUMENTS 6,640,321 B1 * 10/2003 Huang et al. ................. 714/720
6,691,264 B2 * 2/2004 Huang ......................... 714/723
6,967,878 B2 * 11/2005 Dono .......................... 365/200
7,047,461 B2 * 5/2006 Yamazaki et al. ........... 714/719
7,379,357 B2 * 5/2008 Kang ........................... 365/200

FOREIGN PATENT DOCUMENTS

WO 02/33708 A1 4/2002

* cited by examiner

TEST APPARATUS, TEST METHOD, ANALYZING APPARATUS AND COMPUTER READABLE MEDIUM

CROSS REFERENCE TO RELATED APPLICATION

This is a continuation application of PCT/JP2006/316638 filed on Aug. 24, 2006 which claims priority from a Japanese Patent Application No. 2005-268728 filed on Sep. 15, 2005, the contents of which are incorporated herein by reference.

BACKGROUND

1. Technical Field

The present invention relates to a test apparatus, a test method, a calculating apparatus and a computer-readable medium. More particularly, the present invention relates to a test apparatus, a test method, a calculating apparatus and a computer-readable medium which calculate a remedy solution for a defective storage cell in a memory under test.

2. Related Art

FIG. 5 illustrates the configuration of a conventional test apparatus 100 which calculates a remedy solution for replacing a defective storage cell in a semiconductor memory with a backup cell (for example, see Non-patent Document 1).

The test apparatus 100 includes therein a plurality of test signal feeding sections 120, a plurality of defect detecting sections 130, a plurality of fail memories 140, and a plurality of calculating sections 150. Each of the test signal feeding sections 120 feeds a test signal to a corresponding one of a plurality of memories under tests 110. Each of the defect detecting sections 130 detects information identifying a defective storage cell in a corresponding one of the memories under test 110 (fail information) with reference to the data read from the corresponding memory under test 110 in response to the test signal, and writes the detected fail information into a corresponding one of the fail memories 140. The fail information written on each of the fail memories 140 is transferred to a corresponding one of the calculating sections 150 on completion of the test on a corresponding one of the memories under test 110. Each of the calculating sections 150 obtains a remedy solution for a corresponding one of the memories under test 110 with reference to the fail information transferred thereto. Here, the calculating sections 150 perform the processing to obtain the remedy solutions while the test signal feeding sections 120 and the defect detecting sections 130 perform tests.

Non-patent Document 1: Jin-Fu Li and 6 other members, "A Built-In Self-Repair Scheme for Semiconductor Memories with 2-D Redundancy", INTERNATIONAL TEST CONFERENCE, INTERNATIONAL TEST CONFERENCE 2003 PROCEEDINGS, Sep. 30, 2003, p. 393-402

FIG. 6 is a timing chart illustrating the processing timings seen when the conventional test apparatus 100 tests a group of memories under test 110 during one test session.

The test apparatus 100 requires a different duration to calculate a remedy solution for each of the memories under test 110. Therefore, even if each calculating section 150 concurrently starts the calculation for a corresponding one of the memories under test 110, each calculating section 150 finishes the calculation at a different timing. Furthermore, since the remedy solution calculations are NP-complete, it is not known in advance how long the test apparatus 100 will require in order to complete the calculations. For these reasons, one or more of the calculating sections 150 may not complete the calculations by the time the test signal feeding sections 120 and the defect detecting sections 130 finish the tests which are performed in parallel.

Here, until the calculating sections 150 complete the current calculations, the pieces of fail information written in the fail memories 140 are not transferred to the calculating sections 150. Therefore, the defect detecting sections 130 can not start the tests on the next group of memories under test 110 until the calculating sections 150 finish the current calculations. Here, consider a case where the test apparatus 100 tests a group of memories under test 110 during each test session. In this case, if the test apparatus 100 takes a relatively long time to calculate a remedy solution for any one of the memories under test 110 in the tested group, the test apparatus 100 can start testing none of the memories under test 110 included in the next group until completing the relatively lengthy calculation. This means a longer waiting time X from the end of the current tests to the start of the next tests. As a result, the test apparatus 100 suffers from a lowered throughput.

SUMMARY

Therefore, it is an object of an aspect of the innovations herein to provide a test apparatus, a test method, a calculating apparatus and a computer-readable medium, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus for testing a plurality of memories under test. The test apparatus includes a plurality of test signal feeding sections that are provided in a one-to-one correspondence with the plurality of memories under test, where each of the plurality of test signal feeding sections feeds a test signal designed to test a corresponding one of the plurality of memories under test to the corresponding memory under test, a plurality of defect detecting sections that are provided in a one-to-one correspondence with the plurality of memories under test, where each of the plurality of defect detecting sections detects a defect in a corresponding one of the plurality of memories under test when data read from the corresponding memory under test in response to the test signal is different from an expected value, a plurality of first calculating sections that are provided in a one-to-one correspondence with the plurality of memories under test, where each of the plurality of first calculating sections calculates a remedy solution for a corresponding one of the plurality of memories under test and the remedy solution remedies the defect in the corresponding memory under test by replacing a defective storage cell in the corresponding memory under test with a backup cell of the corresponding memory under test, and a second calculating section that takes over, from one or more of the plurality of first calculating sections which have not finished calculating the remedy solutions, the unfinished remedy solution calculations, in response to a start of calculations by the plurality of first calculating sections for remedy solutions for a different group of memories under test, and performs the taken over remedy solution calculations.

According to a second aspect related to the innovations herein, one exemplary test method may include a test method for testing a plurality of memories under test. The test method includes a plurality of test signal feeding steps that are provided in a one-to-one correspondence with the plurality of memories under test, where each of the plurality of test signal feeding steps feeds a test signal designed to test a corresponding one of the plurality of memories under test to the corresponding memory under test, a plurality of defect detecting steps that are provided in a one-to-one correspondence with the plurality of memories under test, where each of the plurality of defect detecting steps detects a defect in a corresponding one of the plurality of memories under test when data read from the corresponding memory under test in response to the test signal is different from an expected value, a plurality of first calculating steps that are provided in a one-to-one correspondence with the plurality of memories under test, where each of the plurality of first calculating steps calculates a remedy solution for a corresponding one of the plurality of memories under test and the remedy solution remedies the defect in the corresponding memory under test by replacing a defective storage cell in the corresponding memory under test with a backup cell of the corresponding memory under test, and a second calculating step of taking over, from one or more of the plurality of first calculating steps in which the remedy solution calculations have not been finished, the unfinished remedy solution calculations, in response to a start of calculations in the plurality of first calculating steps for remedy solutions for a different group of memories under test, and performing the taken over remedy solution calculations.

According to a third aspect related to the innovations herein, one exemplary computer-readable medium, including thereon a program for use with a test apparatus, may include a program for use with a test apparatus that tests a plurality of memories under test when executed. When the program is executed, the computer-readable medium causes the test apparatus to function as a plurality of test signal feeding sections that are provided in a one-to-one correspondence with the plurality of memories under test, where each of the plurality of test signal feeding sections feeds a test signal designed to test a corresponding one of the plurality of memories under test to the corresponding memory under test, a plurality of defect detecting sections that are provided in a one-to-one correspondence with the plurality of memories under test, where each of the plurality of defect detecting sections detects a defect in a corresponding one of the plurality of memories under test when data read from the corresponding memory under test in response to the test signal is different from an expected value, a plurality of first calculating sections that are provided in a one-to-one correspondence with the plurality of memories under test, where each of the plurality of first calculating sections calculates a remedy solution for a corresponding one of the plurality of memories under test and the remedy solution remedies the defect in the corresponding memory under test by replacing a defective storage cell in the corresponding memory under test with a backup cell of the corresponding memory under test, and a second calculating section that takes over, from one or more of the plurality of first calculating sections which have not finished calculating the remedy solutions, the unfinished remedy solution calculations, in response to a start of calculations by the plurality of first calculating sections for remedy solutions for a different group of memories under test, and performs the taken over remedy solution calculations.

According to a fourth aspect related to the innovations herein, one exemplary calculating apparatus may include a calculating apparatus for a test apparatus that tests a plurality of memories under test. Here, the test apparatus includes a plurality of test signal feeding sections that are provided in a one-to-one correspondence with the plurality of memories under test, where each of the plurality of test signal feeding sections feeds a test signal designed to test a corresponding one of the plurality of memories under test to the corresponding memory under test, a plurality of defect detecting sections that are provided in a one-to-one correspondence with the plurality of memories under test, where each of the plurality of defect detecting sections detects a defect in a corresponding one of the plurality of memories under test when data read from the corresponding memory under test in response to the test signal is different from an expected value, and a plurality of first calculating sections that are provided in a one-to-one correspondence with the plurality of memories under test, where each of the plurality of first calculating sections calculates a remedy solution for a corresponding one of the plurality of memories under test and the remedy solution remedies the defect in the corresponding memory under test by replacing a defective storage cell in the corresponding memory under test with a backup cell of the corresponding memory under test. Here, the calculating apparatus takes over, from one or more of the plurality of first calculating sections which have not finished calculating the remedy solutions, the unfinished remedy solution calculations, in response to a start of calculations by the plurality of first calculating sections for remedy solutions for a different group of memories under test, and performs the taken over remedy solution calculations.

According to a fifth aspect related to the innovations herein, one exemplary computer-readable medium, including thereon a program for use with a calculating apparatus, may include a program for use with a calculating apparatus for a test apparatus that tests a plurality of memories under test when executed. Here, the test apparatus includes a plurality of test signal feeding sections that are provided in a one-to-one correspondence with the plurality of memories under test, where each of the plurality of test signal feeding sections feeds a test signal designed to test a corresponding one of the plurality of memories under test to the corresponding memory under test, a plurality of defect detecting sections that are provided in a one-to-one correspondence with the plurality of memories under test, where each of the plurality of defect detecting sections detects a defect in a corresponding one of the plurality of memories under test when data read from the corresponding memory under test in response to the test signal is different from an expected value, and a plurality of first calculating sections that are provided in a one-to-one correspondence with the plurality of memories under test, where each of the plurality of first calculating sections calculates a remedy solution for a corresponding one of the plurality of memories under test and the remedy solution remedies the defect in the corresponding memory under test by replacing a defective storage cell in the corresponding memory under test with a backup cell of the corresponding memory under test. When the program is executed, the computer-readable medium causes the calculating apparatus to take over, from one or more of the plurality of first calculating sections which have not finished calculating the remedy solutions, the unfinished remedy solution calculations, in response to a start of calculations by the plurality of first calculating sections for remedy solutions for a different group of memories under test, and perform the taken over remedy solution calculations.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
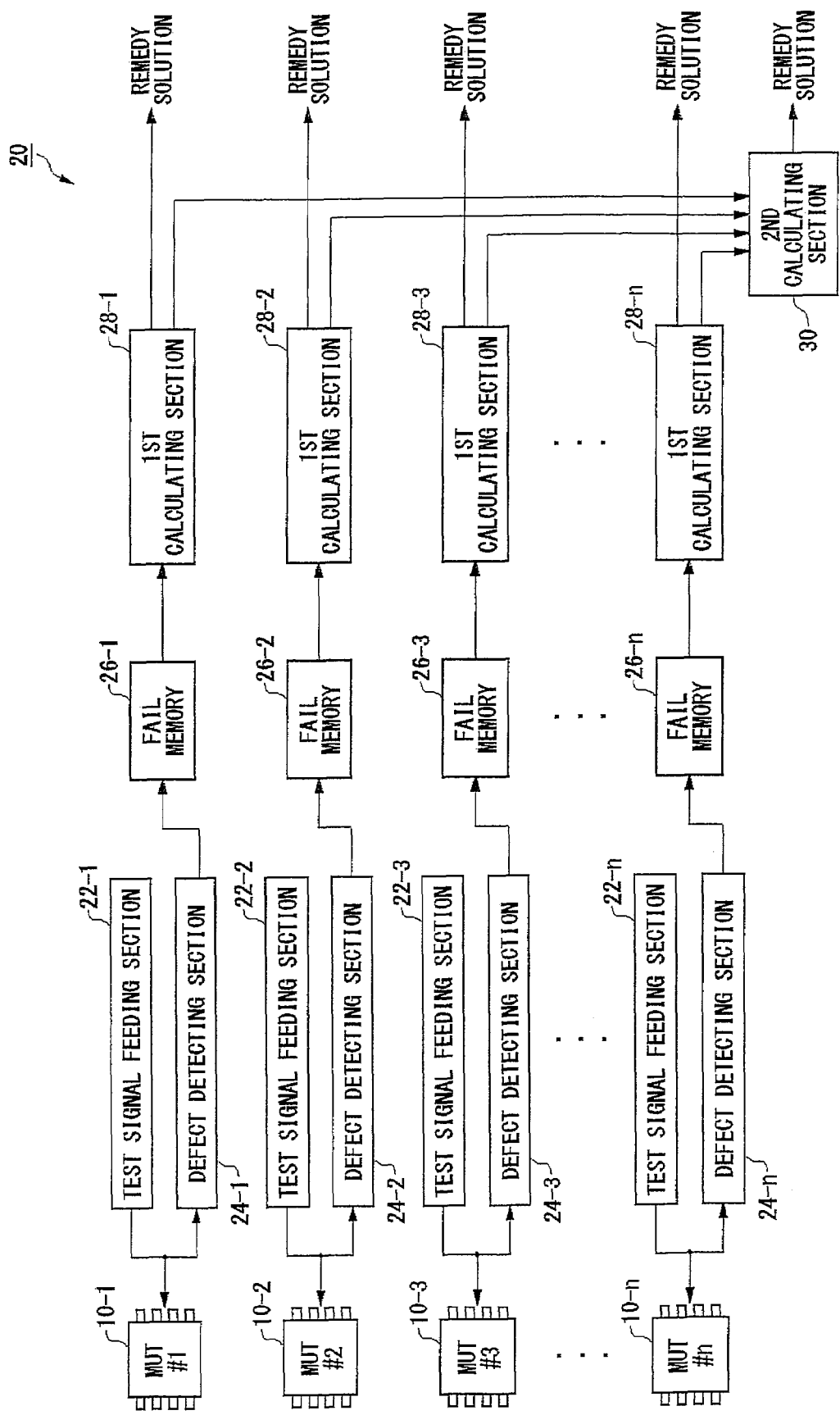
FIG. 1 illustrates the configuration of a test apparatus 20 relating to an embodiment of the present invention.

FIG. 1 illustrates the configuration of a test apparatus 20 relating to an embodiment of the present invention. The test apparatus 20 concurrently tests a plurality of memories under test 10-1 to 10-n (n is a natural number equal to or higher than two, and the memories under test 10-1 to 10-n are hereinafter collectively referred to as the memories under test 10). With reference to the test results, the test apparatus 20 efficiently calculates, for each of the memories under test 10, a remedy solution to replace a defective storage cell in the memory under test 10 with a backup cell. Referring to the test apparatus 20, the memories under test 10 may be individual devices, or individual blocks obtained by partitioning the storage region of a semiconductor memory chip.

The test apparatus 20 includes therein a plurality of test signal feeding sections 22-1 to 22-n, a plurality of defect detecting sections 24-1 to 24-n, a plurality of fail memories 26-1 to 26-n, a plurality of first calculating sections 28-1 to 28-n, and a second calculating section 30.

The test signal feeding sections 22-1 to 22-n (hereinafter, collectively referred to as the test signal feeding sections 22) are provided in a one-to-one correspondence with the memories under test 10. Each test signal feeding section 22 feeds a test signal to test a corresponding one of the memories under test 10, to the corresponding memory under test 10.

The defect detecting sections 24-1 to 24-n (hereinafter, collectively referred to as the defect detecting sections 24) are provided in a one-to-one correspondence with the memories under test 10. Each defect detecting section 24 detects a defect in a corresponding one of the memories under test 10 when the data read from the corresponding memory under test 10 in response to the test signal is different from an expected value. Specifically speaking, each defect detecting section 24 detects a defective storage cell from among the large number of storage cells of the corresponding memory under test 10. Each defect detecting section 24 writes information identifying the detected defective storage cell (fail information) into a corresponding one of the fail memories 26-1 to 26-n.

The fail memories 26-1 to 26-n (hereinafter, collectively referred to as the fail memories 26) are provided in a one-to-one correspondence with the memories under test 10. Each fail memory 26 stores thereon the fail information for a corresponding one of the memories under test 10 which is written by a corresponding one of the defect detecting sections 24. The fail information written into each fail memory 26 is transferred to a corresponding one of the first calculating sections 28-1 to 28-n after the test of the corresponding memory under test 10 is completed. For example, the fail information is transferred in such a manner that the data stored on each fail memory 26 is read by a corresponding one of the first calculating sections 28-1 to 28-n.

The first calculating sections 28-1 to 28-n (hereinafter, collectively referred to as the first calculating sections 28) are provided in a one-to-one correspondence with the memories under test 10. Each first calculating section 28 receives the fail information stored on a corresponding one of the fail memories 26. With reference to the fail information transferred thereto, each first calculating section 28 calculates a remedy solution designed to remedy the defect of a corresponding one of the memories under test 10 by replacing the defective storage cell in the corresponding memory under test 10 with one of the backup cells of the corresponding memory under test 10.

In response to the start of the remedy solution calculations by the first calculating sections 28 for a next group of memories under test 10, the second calculating section 30 takes over, from one or more of the first calculating sections 28 which have not finished calculating the remedy solutions, the unfinished remedy solution calculations, and calculates the remedy solutions in place of the one or more of the first calculating sections 28.

The above-described test apparatus 20 sets within the memories under test 10 the remedy solutions calculated by the first calculating sections 28 and the second calculating section 30, to feed each of the calculated remedy solutions back to a corresponding one of the memories under test 10. With the calculated remedy solutions being set within the memories under test 10, when the defective storage cells in the memories under test 10 are accessed for data writing or reading, the memories under test 10 can change the access destinations from the defective storage cells to the backup cells.

Figure 2:
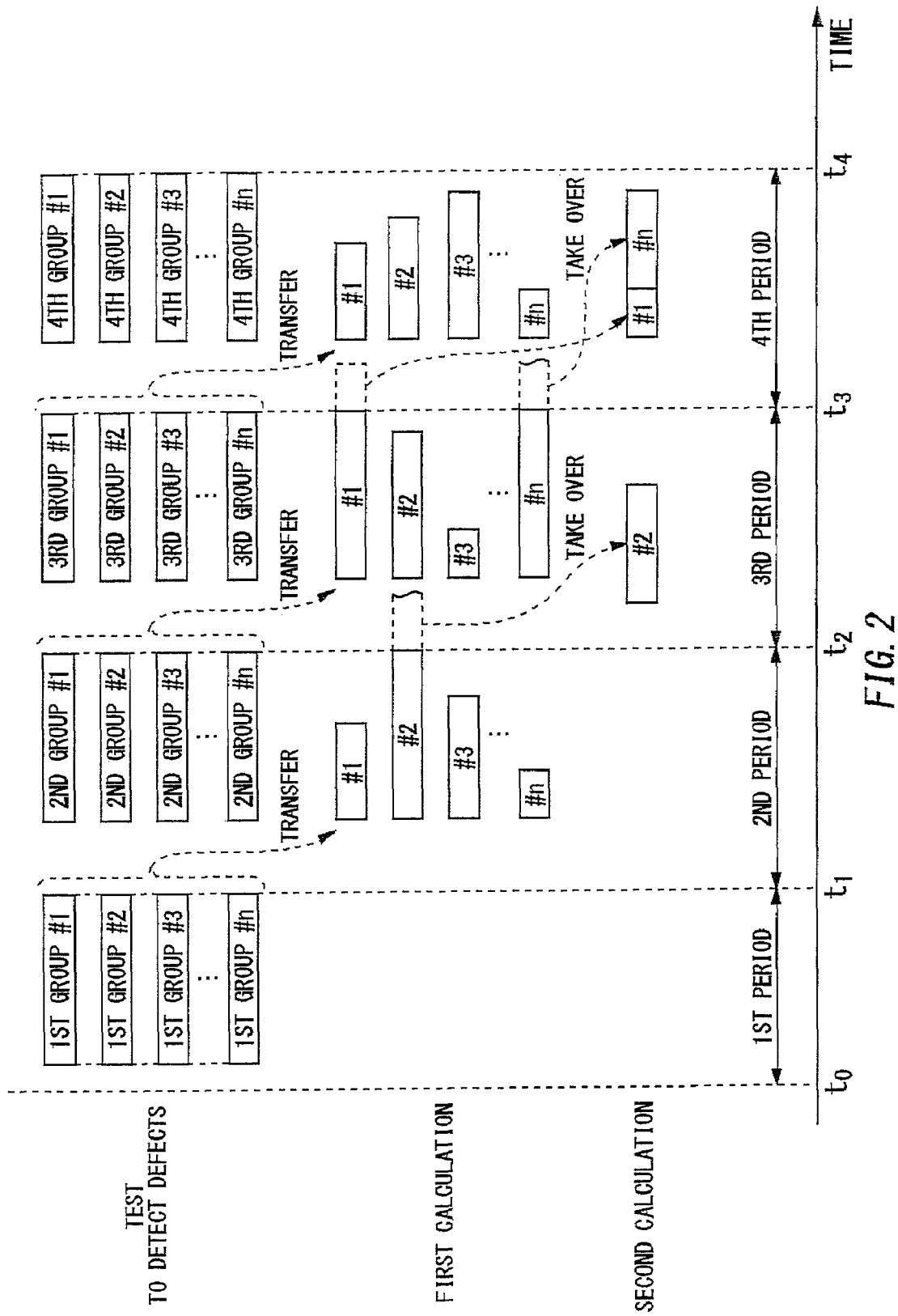
FIG. 2 is a timing chart illustrating the processing timings at the individual constituents of the test apparatus 20.

FIG. 2 is a timing chart illustrating the processing timings of the individual constituents of the test apparatus 20.

The test signal feeding sections 22 and the defect detecting sections 24 test a plurality of memories under test 10 during each test session (for example, test a group of n memories under test 10 during each test session) for detecting defective storage cells. Specifically speaking, to begin with, the test signal feeding sections 22 and the defect detecting sections 24 test an initial group of memories under test 10 (for example, a first group of memories under test 10) (a first period). While testing the initial group (for example, the first group) of memories under test 10, the defect detecting sections 24 write the obtained pieces of fail information (for example, the pieces of fail information for the first group) sequentially into the fail memories 26. On completion of the tests, the pieces of fail information for the first group which have been written into the fail memories 26 are transferred to the first calculating sections 28. For example, on completion of the tests on the first group of memories under test 10, the pieces of fail information associated with the first group of memories under test 10 are transferred to the first calculating sections 28 (at the start of a second period). When the pieces of fail information have been completely transferred, the test signal feeding sections 22 and the defect detecting sections 24 start testing the next group of memories under test 10 (for example, the second group of memories under test 10) (the second period). In the above-described manner, the test signal feeding sections 22 and the defect detecting sections 24 repeatedly perform the fail information transfer operation and the test operation.

When receiving the pieces of fail information transferred from the fail memories 26, the first calculating sections 28 calculate the remedy solutions for the memories under test 10. For example, when receiving from the fail memories 26 the pieces of fail information associated with the first group of memories under test 10 which are tested during the first period, the first calculating sections 28 calculate the remedy solutions for the memories under test 10 included in the first group (the second period).

Note that the test signal feeding sections 22 and the defect detecting sections 24 operate independently from the first calculating sections 28. While the test signal feeding sections 22 and the defect detecting sections 24 perform the processing associated with a given group of memories under test 10, the first calculating sections 28 perform the processing associated with a different group of the memories under test 10. Take as an example the second period. The first calculating sections 28 calculate the remedy solutions for a group of memories under test 10 which have already been tested by the test signal feeding sections 22 and the defect detecting sections 24 (for example, the first group of memories under test 10 which are tested immediately before the second group of memories under test 10), while the test signal feeding sections 22 and the defect detecting sections 24 test a different group of memories under test 10 (for example, the second group of memories under test 10).

Here, one or more of the first calculating sections 28 may not complete their calculations by the time the test signal feeding sections 22 and the defect detecting sections 24 complete the tests which are performed in parallel (for example, see the second memory under test 10 in the first group shown in the section of the second period). If such occurs, in response to the end of the tests by the test signal feeding sections 22 and the defect detecting sections 24 on a group of memories under test 10 (for example, the second group of memories under test 10), the second calculating section 30 takes over the unfinished remedy solution calculations from the first calculating sections 28 which have not finished calculating the remedy solutions. For example, the second calculating section 30 takes over the unfinished remedy solution calculations at the end of the tests performed by the test signal feeding sections 22 and the defect detecting sections 24, or when a predetermined time has elapsed after the end of the tests. When more than one of the first calculating sections 28 have not finished calculating the remedy solutions, the second calculating section 30 may take over more than one remedy solution calculation (for example, see a third period).

Once the second calculating section 30 takes over the one or more unfinished remedy solution calculations, the first calculating sections 28 terminate any ongoing calculations. In response to the end of the tests on a group (for example, the second group) of memories under test 10 by the test signal feeding sections 22 and the defect detecting sections 24, the first calculating sections 28 start calculating the remedy solutions for that group (for example, the second group) of memories under test 10.

As described in the above, in the test apparatus 20, when the first calculating sections 28 do not finish the calculations within a predetermined time period, the second calculating section 30 takes over the unfinished calculations. Which is to say, in the test apparatus 20, the first calculating sections 28 perform the remedy solution calculations at regular intervals for a large part of the memories under test 10 for which the remedy solutions can be easily calculated because of, for example, a small number of defective storage cells, and the second calculating section 30 separately and independently performs the remedy solution calculations on a small part of the memories under test 10 for which the remedy solutions can not be easily calculated. As a result, the test apparatus 20 can improve the yield ratio of the memories under test 10 and can also increase the system throughput.

In the test apparatus 20, it is not necessary to provide second calculating sections 30 in a one-to-one correspondence with the memories under test 10. The number of the second calculating sections 30 can be thus set smaller than the number of the memories under test 10. Therefore, the second calculating section 30 may be realized by using, for example, an information processing apparatus that is more expensive but has a higher computing capability than the first calculating sections 28, so that the system as a whole can achieve the enhanced processing capability.

Alternatively, the second calculating section 30 can be realized by using an information processing apparatus connected to the first calculating sections 28 via a network.

As a further alternative example, the second calculating section 30 can be realized by installing a program onto a computer. The program to be installed in the computer is provided by a user by way of a storage medium or via a network.

The program to be installed in the computer and to cause the computer to function as the second calculating section 30 has a module that, in response to the start of the remedy solution calculations by the first calculating sections 28 for a group of memories under test 10, takes over the unfinished remedy solution calculations from one or more of the first calculating sections 28 which have not finished calculating the remedy solutions for a previous group of memories under test 10 and calculates the remedy solutions. The program or module instructs the processor or the like in the computer, so as to cause the computer to function as the second calculating section 30.

The above-described program or module may be stored on an external storage medium. The storage medium is, for example, an optical storage medium such as DVD and CD, a magnet-optical storage medium such as MD, a tape medium, a semiconductor memory such as an IC card and the like, in addition to a flexible disk and a CD-ROM. The storage medium may be a storage device such as a hard disk or RAM which is provided in a server system connected to a dedicated communication network or the Internet, and the program may be provided to the computer via the network.

When the second calculating section 30 takes over the remedy solution calculations from the first calculating sections 28, one or more of the first calculating sections 28 which have not finished calculating the remedy solutions transmit the corresponding pieces of fail information to the second calculating section 30, and the second calculating section 30 starts calculating the remedy solutions with reference to the pieces of fail information received from the first calculating sections 28. When required to transmit the corresponding pieces of fail information, the first calculating sections 28 may be in the middle of the calculations for the calculations. In this case, the first calculating sections 28 may also transmit, to the second calculating section 30, the resulting data obtained by the calculations that have been done. The second calculating section 30 may use the resulting data to calculate the remedy solutions. This can reduce the quantity of the calculations that have to be done by the second calculating section 30 in the test apparatus 20.

On condition that the second calculating section 30 has no unfinished calculations which have been taken over from the first calculating section 28, the second calculating section 30 may perform part of the calculation assigned to at least one of the first calculating sections 28, while the first calculating sections 28 perform the calculations. In other words, when not performing any calculations, the second calculating section 30 may help the first calculating sections 28 to perform the calculations. In this manner, the test apparatus 20 can make efficient use of the computation resource provided by the second calculating section 30.

In a case where the second calculating section 30 takes over the unfinished remedy solution calculations from the first calculating sections 28 which have not finished calculating the remedy solutions in response to the end of the tests on a given group (for example, the second group) of memories under test 10, the second calculating section 30 performs the taken-over calculations during the test period of testing the next group (for example, the third group) of memories under test 10 (for example, the third period). Here, if the second calculating section 30 has not finished the remedy solution calculations taken over from the first calculating sections 28, for example, by a predetermined time, the second calculating section 30 may terminate the unfinished calculations and judge that the corresponding memories under test 10 can not be remedied. For example, if the second calculating section 30 is still performing the taken-over remedy solution calculations at the end of the tests which are conducted concurrently with the taken-over remedy solution calculations (or when a predetermined time period has elapsed after the end of the tests), the second calculating section 30 terminates the unfinished calculations.

The test apparatus 20 can terminate the calculations by the second calculating section 30 when the calculations by the second calculating section 30 are lengthy, thereby improving the processing efficiency.

Figure 3:
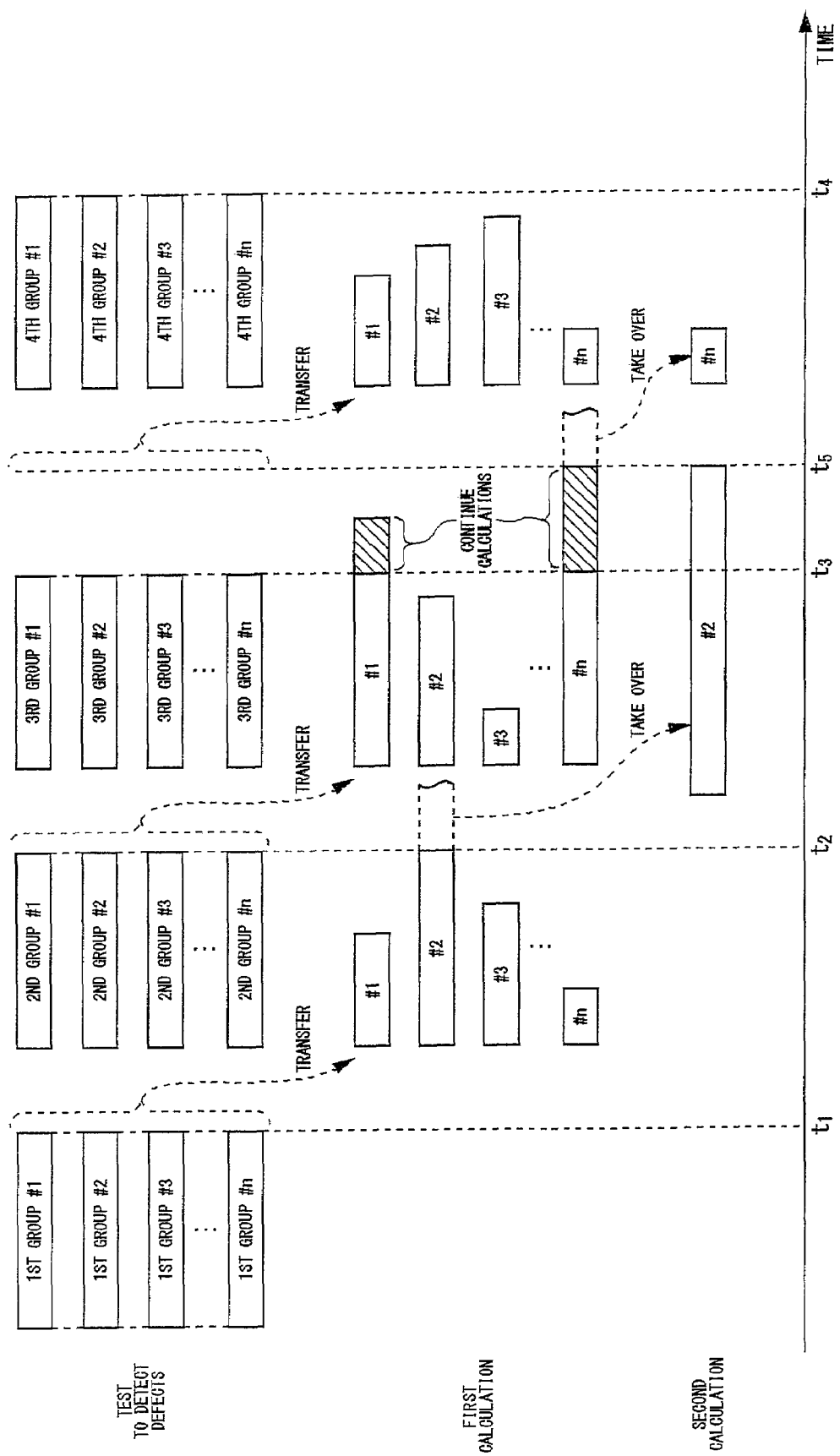
FIG. 3 is a timing chart illustrating the processing timings of the respective constituents of the test apparatus 20 when first calculating sections 28 continue their calculations even after the end of the tests performed in parallel, adaptively to the long time period required by a second calculating section 30 to complete taken-over calculations.

FIG. 3 is a timing chart illustrating the processing timings of the respective constituents of the test apparatus 20 when the first calculating sections 28 continue their calculations even after the end of the tests performed in parallel, adaptively to the long time period required by the second calculating section 30 to complete the taken-over calculations.

In a case where the second calculating section 30 takes over the unfinished remedy solution calculations from the first calculating sections 28 which have not finished calculating the remedy solutions in response to the end of the tests on a certain group (for example, the second group) of memories under test 10, the second calculating section 30 performs the taken-over calculations during the test period of testing the next group (for example, the third group) of memories under test 10 (for example, the third period). During this test period (for example, the third period), the first calculating sections 28 calculate the remedy solutions for the tested certain group (for example, the second group) of memories under test 10.

A case is assumed where the test apparatus 20 has completed the tests on a given group (for example, the third group) of memories under test 10 but the second calculating section 30 has not completed calculating the remedy solutions for a different group (for example, the first group) of memories under test 10. In such a case, the first calculating sections 28 may continue, even after the end of the tests on the given group (for example, the third group) of memories under test 10, calculating the remedy solutions for a further different group (for example, the second group) of memories under test 10 until the second calculating section 30 completes calculating the remedy solutions.

In the test apparatus 20, the first calculating sections 28 continue performing the calculations after the end of the tests until the second calculating section 30 completes the calculations as stated above. This configuration can prevent the second calculating section 30 from being heavily loaded with the calculations, thereby preventing an increase in the waiting time. As a result, the test apparatus 20 can efficiently perform the tests.

Figure 4:
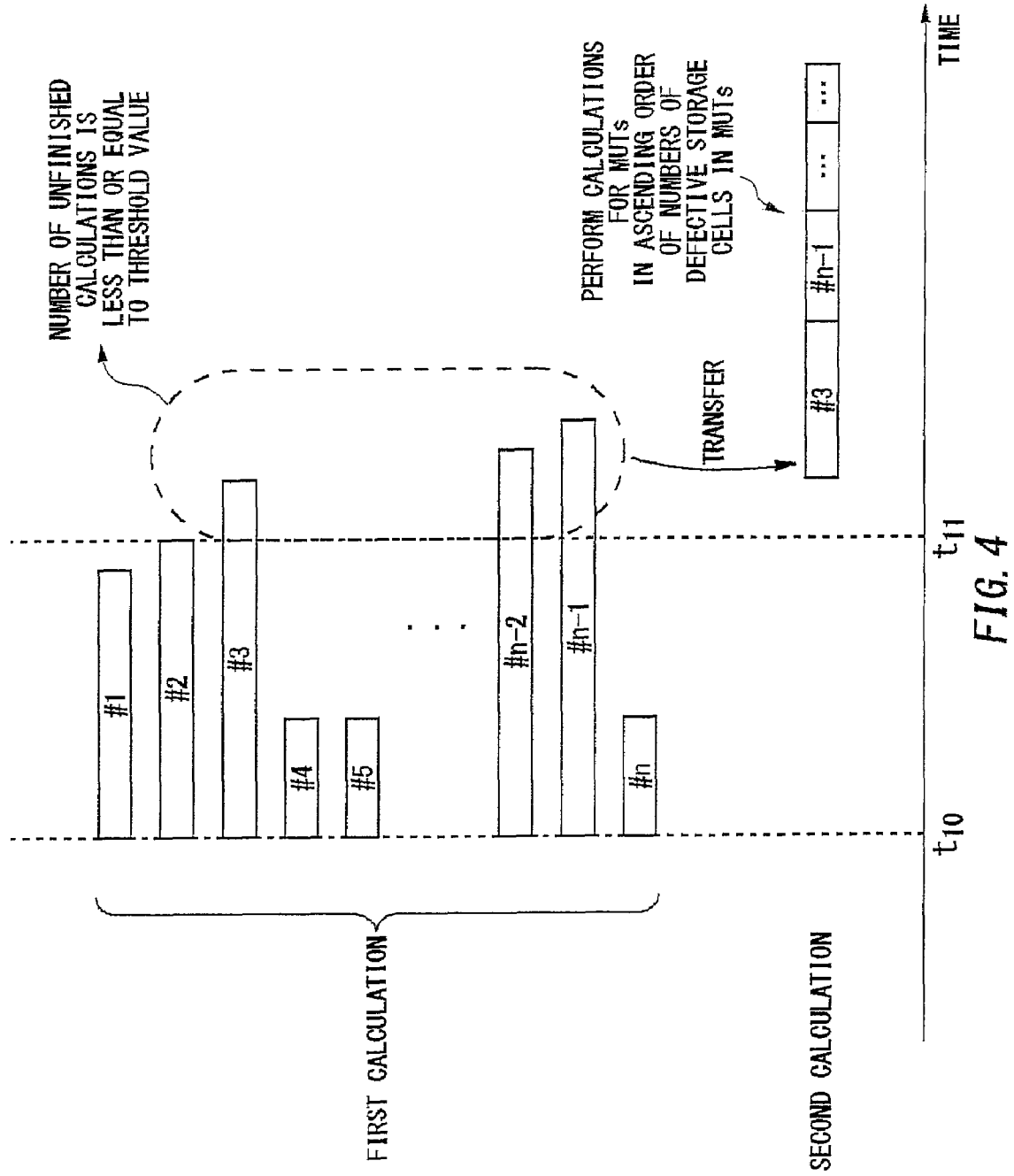
FIG. 4 illustrates the processing time period required by each first calculating section 28 and the order in which the second calculating section 30 performs calculations.
Figure 5:
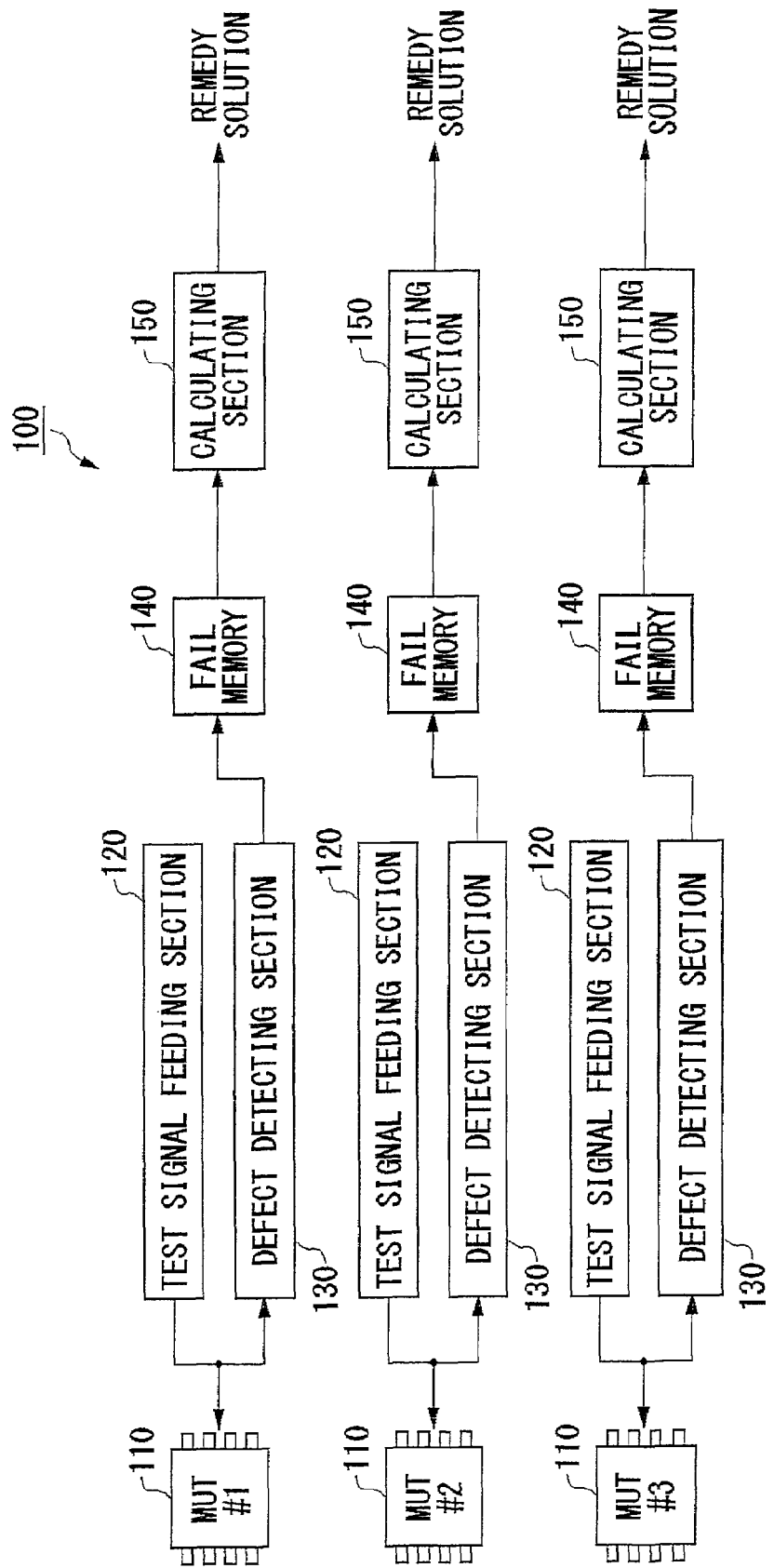
FIG. 5 illustrates the configuration of a conventional test apparatus 100.
Figure 6:
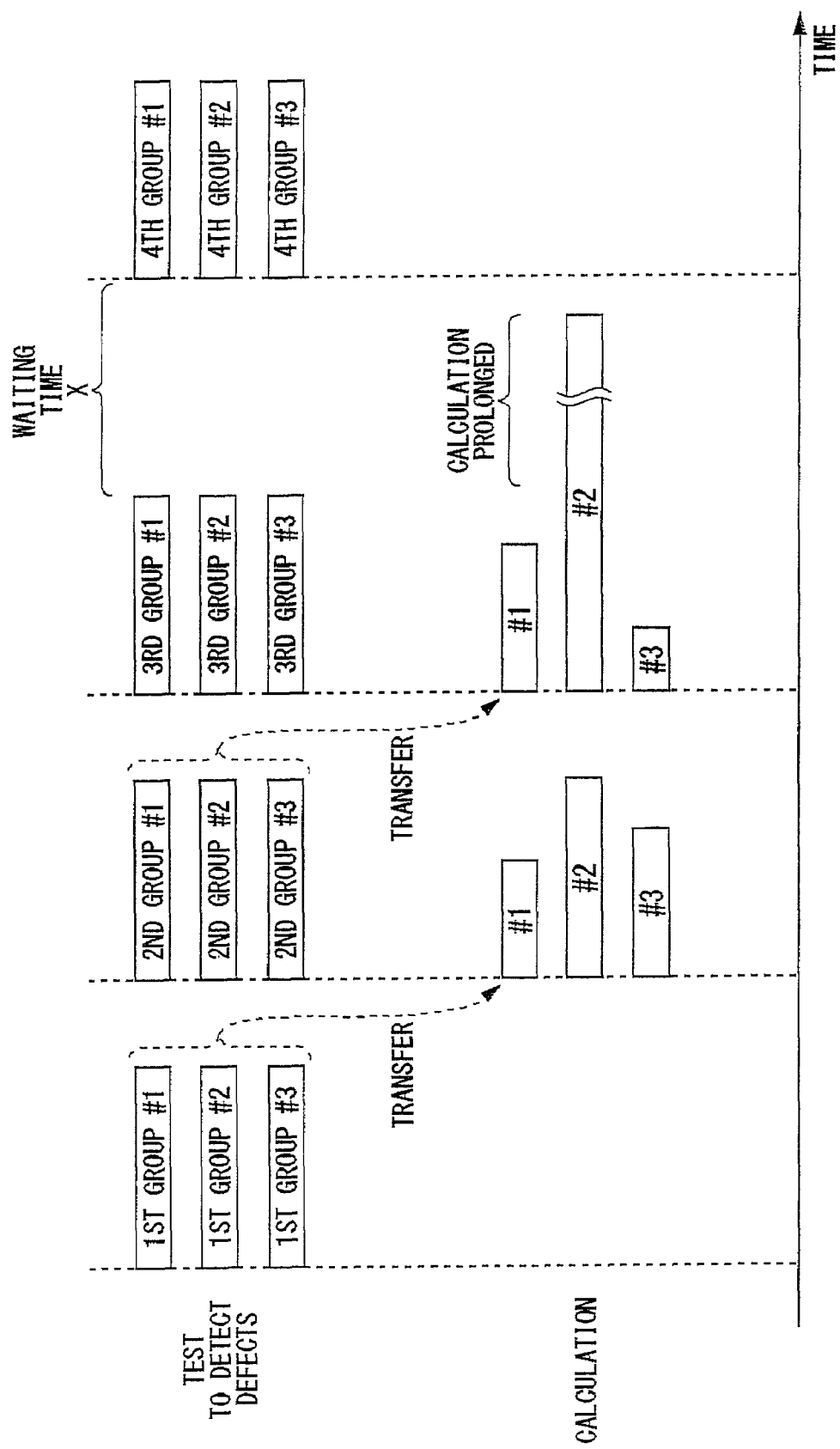
FIG. 6 is a timing chart illustrating the processing timings seen when the conventional test apparatus 100 tests a group of memories under test during each test session.

FIG. 4 illustrates the processing time period required by each first calculating section 28 and the order in which the second calculating section 30 performs the calculations.

At such a timing that the first calculating sections 28 can start calculating the remedy solutions for a new group of memories under test 10, the second calculating section 30 may take over the unfinished remedy solution calculations from the first calculating sections 28 which have not finished calculating the remedy solutions, on condition that the number of first calculating sections 28 which have not finished calculating the remedy solutions is lower than or equal to a predetermined threshold value. For example, the second calculating section 30 may take over the unfinished remedy solution calculations, on condition that the second calculating section 30 has no unfinished calculations thereon and the number of first calculating sections 28 which have not finished calculating the remedy solutions is lower than or equal to such a number that the second calculating section 30 can complete the taken-over calculations within the test period of testing one group of memories under test 10.

In the above-described manner, the test apparatus 20 determines the timing at which the second calculating section 30 takes over the unfinished remedy solution calculations. With such a configuration, the second calculating section 30 can take over the unfinished remedy solution calculations as soon as possible within the processing capability of the second calculating section 30. As a result, the test apparatus 20 can improve the processing speed as a whole.

When taking over the remedy solution calculations for two or more memories under test 10 from two or more first calculating sections 28, the second calculating section 30 may perform the remedy solution calculations in the ascending order of the numbers of the defective storage cells in the memories under test 10.

By determining the order of performing the calculations in the above manner, the test apparatus 20 can calculate the remedy solutions for the memories under test 10 in such an order that the easier the calculations are expected to be, the earlier the calculations are performed. Therefore, the test apparatus 20 can reduce the number of memories under test 10 which are judged not to be able to be remedied since it is difficult to calculate the remedy solutions.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

What is claimed is:

1. A test apparatus for testing a plurality of memories under test, comprising:
   a plurality of test signal feeding sections that are provided in a one-to-one correspondence with the plurality of memories under test, each of the plurality of test signal feeding sections feeding a test signal designed to test a corresponding one of the plurality of memories under test to the corresponding memory under test;

a plurality of defect detecting sections that are provided in a one-to-one correspondence with the plurality of memories under test, each of the plurality of defect detecting sections detecting a defect in a corresponding one of the plurality of memories under test when data read from the corresponding memory under test in response to the test signal is different from an expected value;

a plurality of first calculating sections that are provided in a one-to-one correspondence with the plurality of memories under test, each of the plurality of first calculating sections calculating a remedy solution for a corresponding one of the plurality of memories under test, the remedy solution remedying the defect in the corresponding memory under test by replacing a defective storage cell in the corresponding memory under test with a backup cell of the corresponding memory under test; and a second calculating section that takes over, from one or more of the plurality of first calculating sections which have not finished calculating the remedy solutions, the unfinished remedy solution calculations, in response to a start of calculations by the plurality of first calculating sections for remedy solutions for a different group of memories under test, and performs the taken over remedy solution calculations.

2. The test apparatus as set forth in claim 1, wherein
the plurality of first calculating sections calculate remedy solutions for a first group of memories under test which have been tested, while the plurality of test signal feeding sections and the plurality of defect detecting sections test a second group of memories under test,
the second calculating section takes over, from one or more of the plurality of first calculating sections which have not finished calculating the remedy solutions for the first group of memories under test, the unfinished remedy solution calculations, in response to an end of the test that is conducted on the second group of memories under test by the plurality of test signal feeding sections and the plurality of defect detecting sections, and
the plurality of first calculating sections start calculating remedy solutions for the second group of memories under test in response to the end of the test that is conducted on the second group of memories under test by the plurality of test signal feeding sections and the plurality of defect detecting sections.

3. The test apparatus as set forth in claim 2, wherein
when taking over, from one or more of the plurality of first calculating sections which have not finished calculating the remedy solutions for the second group of memories under test, the unfinished remedy solution calculations, the second calculating section terminates one or more of the taken over remedy solution calculations for the first group of memories under test which have not been finished, and judges that corresponding one or more of the memories under test in the first group are not able to be remedied.

4. The test apparatus as set forth in claim 2, wherein
the plurality of first calculating sections calculate the remedy solutions for the second group of memories under test which have been tested, while the plurality of test signal feeding sections and the plurality of defect detecting sections test a third group of memories under test, and when the plurality of test signal feeding sections and the plurality of defect detecting sections finish testing the third group of memories under test but the second calculating section has not finished the taken over remedy solution calculations for the first group of memories under test, the plurality of first calculating sections continue calculating the remedy solutions for the second group of memories under test until the second calculating section finishes the taken over remedy solution calculations for the first group of memories under test.

5. The test apparatus as set forth in claim 1, wherein
at such a timing that the plurality of first calculating sections are capable of starting calculating the remedy solutions for the different group of memories under test,
on condition that the number of first calculating sections which have not finished calculating the remedy solutions is smaller than or equal to a predetermined threshold value, the second calculating section takes over the unfinished remedy solution calculations.

6. The test apparatus as set forth in claim 1, wherein
when taking over the unfinished remedy solution calculations for two or more of the plurality of memories under test from two or more of the plurality of first calculating sections, the second calculating section performs the taken over remedy solution calculations in an ascending order of the numbers of defective storage cells in the two or more memories under test.

7. The test apparatus as set forth in claim 1, wherein
when the data read from the corresponding memory under test in response to the test signal is different from the expected value, each of the plurality of defect detecting sections stores thereon fail information identifying a defective storage cell in the corresponding memory under test,
each of the plurality of first calculating sections calculates the remedy solution with reference to corresponding fail information, and transmits the corresponding fail information to the second calculating section when having not finished calculating the remedy solution by a timing at which the plurality of first calculating sections become capable of starting calculating the remedy solutions for the different group of memories under test, and
the second calculating section starts calculating the remedy solutions associated with one or more pieces of fail information which have been received from the one or more first calculating sections, by using the received pieces of fail information.

8. The test apparatus as set forth in claim 1, wherein
on condition that the second calculating section has no unfinished remedy solution calculations which are taken over from the plurality of first calculating sections,
while the plurality of first calculating sections calculate the remedy solutions, the second calculating section executes part of the remedy solution calculation assigned to at least one of the plurality of first calculating section.

9. A test method for testing a plurality of memories under test, comprising:
a plurality of test signal feeding steps that are provided in a one-to-one correspondence with the plurality of memories under test, each of the plurality of test signal feeding steps feeding a test signal designed to test a corresponding one of the plurality of memories under test to the corresponding memory under test;
a plurality of defect detecting steps that are provided in a one-to-one correspondence with the plurality of memories under test, each of the plurality of defect detecting steps detecting a defect in a corresponding one of the plurality of memories under test when data read from the corresponding memory under test in response to the test signal is different from an expected value;

a plurality of first calculating steps that are provided in a one-to-one correspondence with the plurality of memories under test, each of the plurality of first calculating steps calculating a remedy solution for a corresponding one of the plurality of memories under test, the remedy solution remedying the defect in the corresponding memory under test by replacing a defective storage cell in the corresponding memory under test with a backup cell of the corresponding memory under test; and a second calculating step of taking over, from one or more of the plurality of first calculating steps in which the remedy solution calculations have not been finished, the unfinished remedy solution calculations, in response to a start of calculations in the plurality of first calculating steps for remedy solutions for a different group of memories under test, and performing the taken over remedy solution calculations.

10. A computer-readable medium including thereon a program for use with a test apparatus that tests a plurality of memories under test, the computer-readable medium that, by executing the program, causes the test apparatus to function as:

a plurality of test signal feeding sections that are provided in a one-to-one correspondence with the plurality of memories under test, each of the plurality of test signal feeding sections feeding a test signal designed to test a corresponding one of the plurality of memories under test to the corresponding memory under test;

a plurality of defect detecting sections that are provided in a one-to-one correspondence with the plurality of memories under test, each of the plurality of defect detecting sections detecting a defect in a corresponding one of the plurality of memories under test when data read from the corresponding memory under test in response to the test signal is different from an expected value;

a plurality of first calculating sections that are provided in a one-to-one correspondence with the plurality of memories under test, each of the plurality of first calculating sections calculating a remedy solution for a corresponding one of the plurality of memories under test, the remedy solution remedying the defect in the corresponding memory under test by replacing a defective storage cell in the corresponding memory under test with a backup cell of the corresponding memory under test; and a second calculating section that takes over, from one or more of the plurality of first calculating sections which have not finished calculating the remedy solutions, the unfinished remedy solution calculations, in response to a start of calculations by the plurality of first calculating sections for remedy solutions for a different group of memories under test, and performs the taken over remedy solution calculations.

11. A calculating apparatus for a test apparatus that tests a plurality of memories under test, wherein the test apparatus comprises:

a plurality of test signal feeding sections that are provided in a one-to-one correspondence with the plurality of memories under test, each of the plurality of test signal feeding sections feeding a test signal designed to test a corresponding one of the plurality of memories under test to the corresponding memory under test;

a plurality of defect detecting sections that are provided in a one-to-one correspondence with the plurality of memories under test, each of the plurality of defect detecting sections detecting a defect in a corresponding one of the plurality of memories under test when data read from the corresponding memory under test in response to the test signal is different from an expected value; and a plurality of first calculating sections that are provided in a one-to-one correspondence with the plurality of memories under test, each of the plurality of first calculating sections calculating a remedy solution for a corresponding one of the plurality of memories under test, the remedy solution remedying the defect in the corresponding memory under test by replacing a defective storage cell in the corresponding memory under test with a backup cell of the corresponding memory under test, and the calculating apparatus takes over, from one or more of the plurality of first calculating sections which have not finished calculating the remedy solutions, the unfinished remedy solution calculations, in response to a start of calculations by the plurality of first calculating sections for remedy solutions for a different group of memories under test, and performs the taken over remedy solution calculations.

12. A computer-readable medium including thereon a program for use with a calculating apparatus for a test apparatus that tests a plurality of memories under test, wherein the test apparatus comprises:

a plurality of test signal feeding sections that are provided in a one-to-one correspondence with the plurality of memories under test, each of the plurality of test signal feeding sections feeding a test signal designed to test a corresponding one of the plurality of memories under test to the corresponding memory under test;

a plurality of defect detecting sections that are provided in a one-to-one correspondence with the plurality of memories under test, each of the plurality of defect detecting sections detecting a defect in a corresponding one of the plurality of memories under test when data read from the corresponding memory under test in response to the test signal is different from an expected value; and a plurality of first calculating sections that are provided in a one-to-one correspondence with the plurality of memories under test, each of the plurality of first calculating sections calculating a remedy solution for a corresponding one of the plurality of memories under test, the remedy solution remedying the defect in the corresponding memory under test by replacing a defective storage cell in the corresponding memory under test with a backup cell of the corresponding memory under test, and the computer-readable medium, by executing the program, causes the calculating apparatus to take over, from one or more of the plurality of first calculating sections which have not finished calculating the remedy solutions, the unfinished remedy solution calculations, in response to a start of calculations by the plurality of first calculating sections for remedy solutions for a different group of memories under test, and perform the taken over remedy solution calculations.

* * * * *